United States Patent [19]

Cordani

[11] Patent Number: 5,207,867
[45] Date of Patent: May 4, 1993

[54] COMPOSITION AND METHOD FOR IMPROVING THE SURFACE INSULATION RESISTANCE OF A PRINTED CIRCUIT

[75] Inventor: John L. Cordani, Waterbury, Conn.

[73] Assignee: MacDermid, Incorporated, Waterbury, Conn.

[21] Appl. No.: 852,791

[22] Filed: Mar. 17, 1992

[51] Int. Cl.⁵ .................... B44C 1/22; C23F 1/00; C09K 13/08
[52] U.S. Cl. .................... 156/651; 156/656; 156/666; 156/902; 752/79.3; 134/3
[58] Field of Search ............ 156/629, 630, 651, 655, 156/656, 659.1, 666, 668, 902; 252/79.2, 79.3, 79.4; 134/2, 3; 427/96, 97, 98; 29/846, 852

[56] References Cited

U.S. PATENT DOCUMENTS

| | | | |
|---|---|---|---|
| 3,556,883 | 1/1971 | Naito et al. | 252/79.4 X |
| 4,430,154 | 2/1984 | Stahl et al. | 156/659.1 X |
| 4,581,102 | 4/1986 | Brock | 252/79.3 X |
| 4,978,422 | 12/1990 | Letize et al. | 156/656 |
| 5,049,234 | 9/1991 | Madhusudhan | 252/79.3 X |

*Primary Examiner*—William A. Powell
*Attorney, Agent, or Firm*—St. Onge Steward Johnston & Reens

[57] ABSTRACT

After the stripping or etching away of metal to expose surface areas of insulating resin material in a printed circuit process based upon metal-clad insulating substrate material, the exposed surface areas of insulating material are contacted with a liquid treatment composition, comprised of an aqueous acidic solution containing fluoride ion, effective to remove from the surface areas residual metal species otherwise associated therewith, such that the surface insulation resistance afforded by the insulating surface areas of the printed circuit is improved.

18 Claims, No Drawings

COMPOSITION AND METHOD FOR IMPROVING THE SURFACE INSULATION RESISTANCE OF A PRINTED CIRCUIT

BACKGROUND OF THE INVENTION

The present invention relates to the manufacture of printed circuits and, more particularly, to a composition and process for improving the surface insulation resistance of a printed circuit.

In the manufacture of a printed circuit, a fundamental starting material is an insulating substrate material, typically composed of an epoxy or polyimide resin and typically glass-reinforced, having a thin cladding layer of metal (e.g., copper foil) adherently bonded to one or both of its top and bottom substantially planar surfaces. From this metal-clad printed circuit starting material, a variety of different types of processes can be carried out to provide a printed circuit having a predetermined surface pattern of conductive areas and non-conductive areas. The hallmark of all such processes is the stripping or etching away of the metal cladding layer, either entirely or at selected areas, to there expose the underlying insulating substrate surface.

In a typical process, for example, innerlayer circuits for multilayer printed circuits are fabricated from a copper foil-clad insulating substrate by arranging an etch-resistant material on the copper surfaces (e.g., on the surfaces of the copper foil per se or of a further copper layer built up thereon) in the positive pattern of the desired circuitry. The copper not covered by the etch-resist is then etched away down to the substrate surface, and the resist then removed, to thus provide a surface pattern of circuitry lines or areas separated by insulating substrate areas.

In another typical process, such as for fabricating double-sided printed circuits or for providing circuitry patterns on the outer-facing surfaces of a multilayer printed circuit, a copper foil-clad insulating substrate constitutes the starting material of the doublesided circuit or of the outer-facing layers, as the case may be. Through-holes for conductive interconnection of circuitry layers otherwise separated by insulating substrate material are drilled through the board or multilayer composite, and the surfaces are then metallized (such as by electroless copper) to provide copper metal on the through-hole surfaces and to provide additional copper over the copper foil. An organic plating resist (e.g., from the application, imaging and development of a photoresist) is then applied to board surfaces to provide a plating resist pattern in the negative of the desired circuitry pattern, and additional copper is selectively built up on the non-resist areas via electroplating. Thereafter, an etch-resistant material (e.g., tin-lead or another organic resist) is selectively deposited onto the exposed copper areas not covered by the plating resist, and thereafter the plating resist is removed. The board is then treated with a copper etchant to etch away the copper areas (i.e., electroless copper over copper foil) which were previously covered by the plating resist, thereby arriving at a selective pattern of conductive circuitry and insulating substrate areas on the board surfaces. Typical processing steps thereafter may include stripping of the tin-lead or organic etch-resist followed by selective application of a solder mask. If tin-lead was employed as the etch-resist, another option is reflow and fusing of the tin-lead before application of solder mask.

In another type of process, referred to in the art as an additive process, copper foil-clad insulating substrate is first treated to completely strip the copper foil cladding therefrom to expose the underlying insulating substrate surface, and the surface then selectively additively metal plated to arrive at a printed circuit having a desired surface pattern of conductive circuitry areas separated by insulating substrate areas.

Critical to the functionality of printed circuits is the electrical integrity of the selective conductive paths and areas, as provided by the selective areas of insulating material which separate them on the board surface. To this end, the insulating material used in producing the copper foil clad substrates as the starting material in printed circuit manufacture is chosen to have a high electrical resistance. The surface of insulating material exposed after the stripping or etching away of the cladding during the printed circuit manufacturing process generally exhibits somewhat less resistivity than the original insulating material itself. This is sometimes as a consequence of incomplete stripping or etching away of copper, but more commonly is as a consequence of the presence on the surface of metal species from compounds (e.g., zinc and/or chrome compounds) employed by the manufacturers of printed circuit starting material in the process of adhering the copper foil to the insulating substrate. These metal species are apparently so intimately associated with the board surface as to resist complete removal in the copper stripping or etching process. The decreased resistivity of the insulating material surface brought about by the presence of these metal species can be tolerated in certain printed circuits where relatively large insulating areas separate conductive areas. However, the trend today is toward much more complex and dense circuitry patterns, and as a consequence poor resistivity of the insulating surface areas, and particularly latent conductive paths thereon resulting from retained metal species, can readily lead to undesired cross-talk and shorting between closely-spaced conductive areas.

Commonly-assigned U.S. Pat. No. 4,978,422 to Letize addresses the foregoing problems and describes a process whereby the insulating areas of a printed circuit board which are exposed after a copper etching are thereafter contacted with an aqueous alkaline permanganate solution at conditions effective to remove from the insulating areas a sufficient quantity of metal species so as to improve the electrical resistance afforded by the insulating areas in the printed circuit, followed then by neutralization of any residual manganese species. According to the Letize '422 Patent, the contact with alkaline permanganate effects the removal of a thin surface layer of the insulating substrate material, and with it the metal species embedded in or otherwise associated with the surface layer.

Although effective for its stated purpose, the permanganate process of Letize is not without some disadvantages in commercial practice. One difficulty is economic, in that the necessity for two processing steps (treatment with alkaline permanganate, and neutralization of residual manganese species) adds material expense and extends processing time. Another potential difficulty is the risk posed by too substantial or aggressive an attack of the insulating substrate, and removal of more than desired portions thereof, by the alkaline permanganate solution if not carefully controlled.

SUMMARY OF THE INVENTION

It is a primary object of the present invention to provide a process for fabricating printed circuits from metal-clad insulating substrate materials, in which the electrical resistance of the insulating substrate material is maintained at a sufficiently high level so as to avoid, e.g., problematical cross-talk and/or shorting between or among conductive areas of the printed circuit.

Another more specific object of the invention is to provide a process for treating insulating substrate surfaces, which are exposed in the stripping or etching of copper from a copper-clad insulating substrate material, to increase the resistance of the exposed insulating substrate surfaces.

Yet another object of the invention is to provide compositions for use in the foregoing processes.

These and other objects are provided by an improvement in those processes for fabricating a printed circuit in which a printed circuit material, composed of an insulating substrate resin material having a thin metal cladding layer adhered to at least one surface thereof, is treated (i.e. stripped or etched) in order to remove all or selected portions of the metal cladding layer, and thereby expose the underlying insulating substrate resin material, in the course of providing a printed circuit having a predetermined surface pattern of conductive areas and insulating areas composed of the insulating substrate resin material. The improvement in such processes comprises contacting the so-exposed insulating areas with a liquid treatment composition comprising an aqueous acidic solution containing fluoride ion. The formulation of this liquid treatment composition, and the time and conditions of contact of the exposed insulating areas therewith, are dictated by the functional criterion of bringing about a microetching of the surface of the exposed insulating areas to a degree sufficient to loosen and remove a sufficient quantity of the metal species originally affixed to or associated with the surface so as to result in the surface having a greater electrical resistance than existed before the contacting.

Utilizing the method of this invention, improved surface insulation resistance is achieved in a single treatment step, in contrast to the two-step permanganate/neutralization method required by the aforementioned Letize '422 Patent. Moreover, the etching of the exposed insulating areas to bring about removal of metal species can be more easily controlled in the present invention than is the case for the method of the Letize '422 Patent, with the result that the process can achieve its intended purpose without any concern for too substantial or too aggressive an attack on the insulating substrate. Yet further, the process of the invention, and the compositions employed therein, afford potential for combining certain processing steps in the fabrication of a printed circuit.

DETAILED DESCRIPTION OF THE INVENTION

The process of the present invention is generally applicable to any printed circuit material comprised of a metal-clad insulating substrate, in which the metal (e.g., copper foil) cladding has been adhered to the surface or surfaces of the substrate by means which involve metallic compounds such that, after stripping or etching of metal cladding to expose an underlying insulating substrate surface, residual metal species result in a decrease of the resistance of the substrate surface and the potential for providing conductive paths which could lead to cross-talk and/or shorting between conductive areas separated from each other by the insulating surface. The insulating substrate material generally will be chosen so as to have an inherent resistance of at least about $10^8$ ohms, and a purpose of the invention is to arrange that, after steps for fabricating a printed circuit, the surface areas of this insulating substrate material which separate desired conductive surface areas will have a similarly high resistance value. The insulating substrate material can be any suitable dielectric for use in printed circuitry and which is amenable to treatment with a liquid treatment composition according to this invention to effect the surface micro-etching needed to loosen and remove residual metal species. Typically suitable insulating substrate materials include thermosetting and thermoplastic polymers and resins, and most particularly will be epoxy-based or polyimide-based, typically with glass or other reinforcing fibers interspersed therein.

The process of the invention is generally applicable to any printed circuit fabrication technique wherein the metal cladding of the printed circuit material is stripped or etched away, whether completely or selectively, to provide insulating surface areas on the printed circuit. In some cases, the original metal cladding is the only metal stripped or etched away in the process, while in many processes, the cladding will have had built up thereon additional metal thickness by electroless and/or electrolytic processes, all as well known in the art, such that the etching down to the insulating substrate surface requires etching away of more than just the metal cladding at those areas.

In one embodiment of the invention, the contact of the exposed surface areas of insulating substrate material with a liquid treatment composition according to the invention will be carried out as a separate and distinct treatment step at an appropriate time after the stripping or etching away of the metal cladding layer, or selective portions thereof, has been effected in the printed circuit fabrication process.

For example, in additive processes, the metal-clad printed circuit material can be first treated to strip away all the copper cladding, using a suitable copper stripping composition, to expose the surface of insulating material, and thereafter contacted with the liquid treatment composition according to the invention to improve the surface insulation resistance of the so-exposed insulating material surface. In such processes, it generally will be preferred to carry out this step prior to any additive metal plating steps; in such cases, not only is the benefit of improved surface insulation resistance obtained, but there also results a reduced incidence of extraneous plating as can often occur if residual metal species remained on the surface after the stripping of the cladding. Alternatively, however, the contacting with the liquid treatment composition in such processes might also be delayed until after all or some of the steps to arrive at a selectively metal plated surface have been carried out.

In further example of proceeding according to the embodiment in which the contact of the exposed surfaces of insulating material with the liquid treatment composition according to the invention is carried out as a separate and distinct step after stripping or etching away of the metal cladding layer, printed circuit fabrication processes involving a subtractive technique, i.e., selective etching away of metal to form a circuitry pattern, would make use of the invention after the selective etching process had been carried out. Thus, in fabricating innerlayers, for example, the contacting of the exposed surface areas of insulating substrate resin material would be carried out after the selective etching process and, e.g., either before or after removal of organic resist material. In the fabrication of doublesided circuits or in the provision of circuitry on outer layers of multilayer circuits, here again the contacting, after selective etching, can be carried out before or after stripping of the etch resist. If a metallic etch resist is employed, such as tin-lead, and if the metal etch resist is to be reflowed and fused rather than stripped, it is preferred to carry out the contacting of the exposed surface areas of insulating resin material after this reflow and fusing. In any process where selected areas of the surface are to be solder masked (e.g., all areas other than through-holes, surrounding pads and any surface mount areas), then obviously the contacting step will be carried out before solder masking.

In an alternative embodiment of the invention, the requisite contacting of the exposed insulating material surfaces with the liquid treatment composition can be made part and parcel of the stripping or etching process itself, i.e., wherein the liquid treatment composition is formulated so as to be effective as a metal (e.g., copper) etchant or stripper per se. When used in this manner, then, the liquid treatment composition first acts to etch away the copper metal and then acts upon the so-exposed insulating material surface to bring about the necessary microetching thereof to a degree sufficient to loosen and remove metal species originally affixed to or associated with the surface so as to result in the surface having a greater electrical resistance than would otherwise exist if a conventional copper etchant or stripper would have been employed.

As will be apparent, then, there are a wide variety of printed circuit fabrication processes to which the present invention is applicable, and as a consequence there is an equally wide variety of possible and logical points in those processes where the process of the invention can, or will best, be carried out.

The key characteristic of the liquid treatment composition utilized in the process of the invention is that it be capable of effecting a surface micro-etching of the particular resin material which is utilized as the insulating substrate material in the printed circuit, to an extent at least sufficient to loosen and remove from the surface a sufficient quantity of the metal species otherwise affixed to or associated with the surface so as to result in the surface having a greater electrical resistance than would otherwise exist in the absence of the contacting with the liquid treatment composition. As such, the choice of a particular liquid treatment composition will be dictated at least in part by the particular resin material in question.

Generally speaking, the useful liquid treatment compositions according to the invention are aqueous acidic solutions containing fluoride ion. Generally, the solution will have a pH of less than 2.0, and more preferably a pH of 1.0 or less. The acids for use in the solution most typically will be mineral acids such as sulfuric acid, hydrochloric acid or the like. The fluoride ion, which can be provided by means of any suitable solution-soluble source thereof, such as sodium bifluoride, hydrofluoric acid, ammonium bifluoride, sodium or ammonium fluoride, fluoboric acid, and the like or mixtures thereof, generally need be present only in relatively low concentration, such as in the range of from about 0.1 g/l to about 100 g/l, and more preferably in the range of from about 1 g/l to about 10 g/l. Other compounds may, of course, also be present in the solution so long as they do not detract from the ability of the solution to achieve a surface micro-etching of the exposed insulating areas to the degree necessary to bring about loosening and removal from such surface of metal species otherwise affixed to or associated with the surface.

As previously noted, the requisite contacting of the insulating material surface with the liquid treatment composition to effect the required micro-etching of the surface and loosening and removal therefrom of metal species otherwise affixed to or associated therewith, can be made part of the metal etching or stripping process per se. In such situations, the liquid treatment composition necessarily will be formulated so as to be an effective metal (e.g., copper) etchant or stripper, and thus will include at the least, in addition to the fluoride ion, an oxidizing agent for the metal to be etched, such as hydrogen peroxide for situations where the metal is copper. In this embodiment, then, the liquid treatment composition, comprised of an aqueous acidic solution (preferably sulfuric acid) containing fluoride ion and hydrogen peroxide, first acts upon the copper metal to oxidize and solubilize it as an acid salt, and thus remove it from the insulating substrate surface, and then proceeds to act upon the insulating substrate surface per se to effect the necessary microetching thereof to the degree necessary to loosen and remove the surface-affixed and/or surface-associated metal species which otherwise impede the attainment of high surface insulation resistance.

In terms of contact with the insulating material surface per se, i.e., whether as a completely separate treatment step after a separate stripping or etching away of the metal cladding, or simply as the final portion of the stripping or etching process itself using the liquid treatment composition, the requisite micro-etching of the insulating material surface to loosen and remove a sufficient quantity of surface-affixed or surface-associated metal species therefrom generally can be accomplished in a brief time, ranging from 15 seconds to a few minutes depending upon the particular composition employed and the particular resin material involved. The liquid treatment composition generally will be employed at a temperature in the range of from about 70° F. to about 160° F., and more preferably a temperature in the range of from about 70° F. to about 120° F.

The choice of any particular composition and the extent of treatment will essentially be dictated by the result to be achieved. Thus, the surface areas of the insulating substrate resin material which are exposed after the stripping or etching away of all or selected portions of the metal cladding layer, will have affixed thereto or associated therewith a quantity of residual metal species, as earlier discussed. The object of the contacting with the liquid treatment composition is, in essence, to arrange that these metal species, or at the least a substantial proportion thereof, are removed. As such, the treatment with the liquid treatment composition need only act upon the surface of the exposed areas of insulating substrate resin material, and need micro-etch them only to a degree necessary to result in loosening and removal of the metal species such that, at the end of the treatment, a sufficient proportion of the metal species are removed, with result that the surface per se is, in larger part than before, composed of the resin material. In this way, the insulating resistance of the insulating substrate surface is increased, with consequent minimizing of possibilities for cross-talk or shorting between closely adjacent conductive paths.

When the liquid treatment composition is itself to be used as the agent for stripping or etching away all or selected portions of the metal cladding layer from the insulating material surface, the same considerations as above-noted will apply with respect to that portion of the treatment in which the metal stripping or etching has been completed and the insulating material surface itself now is in contact with the liquid treatment composition, with the only difference being that the composition is one formulated to also be effective as the metal stripper or etchant.

The invention is further described an illustrated in the following examples.

EXAMPLE I

A standard copper foil-clad glass-reinforced epoxy panel was drilled to provide through-holes therein, then electrolessly copper plated, patterned with organic resist in the negative of the desired circuitry, the exposed copper areas then built up to further thickness with electroplated copper, and then over-plated with an electroplated tin-lead etch-resist. The organic resist was then removed, and the electroless copper and copper foil thereunder was etched away down to the substrate surface using an ammoniacal copper etchant (Ultra Etch 50, MacDermid, Inc., Waterbury, Conn.). The tin-lead electroplated layer was then stripped.

At this point in the process, measurement was made of the insulating resistance of the so-exposed insulating surfaces, and found to be, on average, $1 \times 10^9$ ohms. Thereafter, the panel was immersed in a 10% w/v solution of sulfuric acid containing 3 g/l sodium bifluoride at 80° F. for 5 minutes and water rinsed. The insulation resistance of the exposed insulating areas was found at that point to be, on average, $1 \times 10^{12.5}$ ohms.

EXAMPLE II

A standard copper foil-clad glass-reinforced epoxy panel was identically processed as in Example I. After stripping of tin-lead, the surface insulation resistance of the so-exposed insulating areas was determined to be $10^9$ ohms on average, and the panel was thereafter immersed in an aqueous 10% w/v solution of sulfuric acid containing 3 g/l sodium bifluoride and 5% by volume of a 50% solution of hydrogen peroxide for 5 minutes at 105° F., and rinsed. Following this treatment, the surface insulation resistance was measured as $1 \times 10^{13.1}$ ohms.

In this Example, it will be seen that the microetching of the insulating material areas selectively exposed by the copper etching is accomplished using the same solution as in Example I, but with hydrogen peroxide also included. The presence of the hydrogen peroxide has no adverse effect on the requisite micro-etching of the insulating surface to remove metal species therefrom, and provides an additional benefit by virtue of simultaneously effecting a micro-etching of the exposed copper surfaces which promotes adherence of these surfaces to a subsequently-applied solder mask.

EXAMPLE III

A standard copper foil-clad glass-reinforced epoxy panel was drilled to provide through holes therein, then electrolessly copper plated, patterned with organic resist in the negative of the desired circuitry, the exposed copper areas then built up to further thickness with electroplated copper and then over-plated with an electroplated tin-lead etch resist. The organic resist was then removed, and the electroless copper and copper foil thereunder was etched away down to the substrate surface using an aqueous solution containing 250 g/l sulfuric acid, 50 g/l hydrogen peroxide and 10 g/l sodium bifluoride.

The tin-lead electroplated layer was then stripped. At this point, measurement was made of the insulating resistance of the exposed insulating surfaces and found to be, on average, $1 \times 10^{12}$ ohms.

A comparison of a similarly prepared panel in which the copper etching was effected with a solution containing 250 g/l sulfuric acid and 50 g/l hydrogen peroxide (i.e., no fluoride ion), yielded a surface insulating resistance measurement of $1 \times 10^{9.9}$.

EXAMPLE IV

A standard copper foil-clad glass reinforced polyimide panel was identically processed as in Example I. After stripping of tin-lead, the surface insulation resistance of the exposed insulating areas was determined to be $1 \times 10^{10.5}$ ohms on average. The panel was thereafter immersed in an aqueous solution of 25 g/l of sulfuric acid, 20 g/l hydrogen peroxide and 20 g/l hydrofluoric acid. Following this treatment, the surface insulation resistance was measured as $1 \times 10^{13}$ ohms.

The foregoing is provided to illustrate and describe the invention and particular preferred embodiments thereof, and is not to be taken as limiting the scope of the invention except as recited in the appended claims.

What is claimed is:

1. In a process for fabricating a printed circuit, wherein a printed circuit material, composed of an insulating substrate resin material having a thin metal cladding layer adhered to at least one surface thereof, is treated in order to strip or etch therefrom all or portions of said metal cladding layer to thereby expose said insulating substrate resin material in the course of providing a printed circuit material having a surface pattern of conductive areas and insulating areas composed of the insulating substrate resin material, the improvement comprising contacting said exposed insulating areas with a liquid treatment composition comprising an aqueous acidic solution containing fluoride ion, said contacting being for a time, and at conditions, effective to remove from the surface of said exposed insulating areas a sufficient quantity of metal species otherwise affixed to or associated with said surface so as to increase the surface insulation resistance of said exposed insulating areas relative to the surface prior to said contacting.

2. A process according to claim 1 wherein said treating of said printed circuit material in order to strip or etch therefrom all or portions of said metal cladding layer to thereby expose said insulating substrate resin material is carried out as a separate treatment step prior to the contacting of said exposed insulating areas with said liquid treatment composition.

3. A process according to claim 1 wherein said treating of said printed circuit material in order to strip or etch therefrom all or portions of said metal cladding layer to thereby expose said insulating substrate resin material, and said contacting of said exposed insulating areas with said liquid treatment composition, are effected in a single step using said liquid treatment composition.

4. A process according to claim 3 wherein said metal cladding layer comprises copper, and wherein said liquid treatment composition comprises an aqueous acidic solution containing sulfuric acid, hydrogen peroxide and fluoride ion.

5. In a process for fabricating a printed circuit, wherein a printed circuit material, composed of an insulating substrate resin material having a thin metal cladding layer adhered to at least one surface thereof, is selectively etched to remove said metal cladding layer from selected surface areas to there expose said insulating substrate resin material and thus provide a printed circuit material having a surface pattern of conductive areas and insulating areas composed of the insulating substrate resin material, the improvement comprising contacting said exposed insulating areas with a liquid treatment composition comprising an aqueous acidic solution containing fluoride ion, said contacting being for a time, and at conditions, effective to remove from the surface of said exposed insulating areas a sufficient quantity of metal species otherwise affixed to or associated with said surface so as to increase the surface insulation resistance of said exposed insulating areas relative to the surface prior to said contacting.

6. A process according to claim 5 wherein said selective etching to remove said metal cladding layer from selected surface areas to there expose said insulating substrate resin material is carried out as a separate treatment step prior to the contacting of said exposed insulating areas with said liquid treatment composition.

7. A process according to claim 5 wherein said selective etching to remove said metal cladding layer from selected surface areas to there expose said insulating substrate resin material, and said contacting of said exposed insulating areas with said liquid treatment composition, are effected in a single step using said liquid treatment composition.

8. A process according to claim 7 wherein said metal cladding layer comprises copper, and wherein said liquid treatment composition comprises an aqueous acidic solution containing sulfuric acid, hydrogen peroxide and fluoride ion.

9. In a process for fabricating a printed circuit, wherein a printed circuit material, composed of an insulating substrate resin material having a thin metal cladding adhered to the surfaces thereof, is (a) provided with through-holes; (b) thereafter metal plated to metallize the through-hole surfaces and provide additional metal over said thin metal cladding; (c) thereafter provided with a plating resist in the negative of a desired circuitry pattern; (d) thereafter metal plated to provide additional metal over those metal surfaces not covered by said plating resist; (e) thereafter provided with an etch resistant material over those metal surfaces not covered by said plating resist; (f) thereafter treated to remove said plating resist; (g) thereafter treated to etch away the metal of those metal areas previously covered by said plating resist so as to thereby selective expose there surfaces of said insulating substrate resin material; (h) thereafter treated to remove said etch resistant material; and (i) thereafter provided with a solder mask over selected metal areas and insulating substrate resin material areas; the improvement comprising contacting the surfaces of said insulating substrate resin material exposed in step (g), and before step (i), with a liquid treatment composition comprising an aqueous acidic solution containing fluoride ion, said contacting being for a time, and at conditions, effective to remove from the surface of said exposed insulating substrate resin areas a sufficient quantity of metal species otherwise affixed to or associated with said surface so as to increase the surface insulating resistance of said exposed insulating substrate resin areas relative to the surface prior to said contacting.

10. A process according to claim 9 wherein said contacting of the surfaces of said insulating substrate resin material exposed in step (g) is carried out as a step separate and apart from the etching of step (g).

11. A process according to claim 10 wherein said contacting of the surfaces of said insulating substrate resin material exposed in step (g) is carried out before step (h).

12. A process according to claim 10 wherein said contacting of the surfaces of said insulating substrate resin material exposed in step (g) is carried out after step (h).

13. A process according to claim 12 wherein said metal cladding layer and the metal platings of steps (b) and (d) comprise copper, and wherein said liquid treatment composition comprises an aqueous acidic solution containing sulfuric acid, hydrogen peroxide and fluoride ion.

14. A process according to claim 9 wherein said etching of step (g), and said contacting of the surfaces of said insulating substrate resin material exposed in step (g), are effected in a single step using said liquid treatment composition.

15. A process according to claim 14 wherein said metal cladding layer and the metal platings of steps (b) and (d) comprise copper, and wherein said liquid treatment composition comprises an aqueous acidic solution containing sulfuric acid, hydrogen peroxide and fluoride ion.

16. A composition for use in contacting surfaces of insulating substrate resin material exposed as a consequence of the stripping or etching of all or selected portions of the metal cladding of a printed circuit material composed of an insulating substrate resin material having a thin metal cladding layer adhered to at least one surface thereof, so as to micro-etch said surfaces of said insulating substrate resin material to remove therefrom metal species otherwise affixed to or associated with said surfaces and thereby increase the surface insulation resistance of said areas, said composition comprising an aqueous acidic solution containing, in addition to the source of acid, from about 0.1 to about 100 g/l of fluoride ion.

17. A composition according to claim 16 wherein said liquid treatment composition comprises an aqueous acidic solution containing sulfuric acid, hydrogen peroxide, and from about 0.1 to about 100 g/l of fluoride ion.

18. A composition according to claim 16 wherein said fluoride ion is provided in the form of a solution-soluble source of fluoride ion selected from the group consisting of sodium bifluoride, ammonium bifluoride, sodium fluoride, ammonium fluoride, hydrofluoric acid, fluoboric acid, and mixtures thereof.

* * * * *